United States Patent
Shih et al.

(10) Patent No.: US 7,452,822 B2
(45) Date of Patent: Nov. 18, 2008

(54) VIA PLUG FORMATION IN DUAL DAMASCENE PROCESS

(75) Inventors: Jen-Chieh Shih, Yong Kang (TW); Bang-Ching Ho, Hsin-Chu (TW); Jian-Hong Chen, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 362 days.

(21) Appl. No.: 11/352,815

(22) Filed: Feb. 13, 2006

(65) Prior Publication Data
US 2007/0190778 A1   Aug. 16, 2007

(51) Int. Cl.
*H01L 21/302* (2006.01)

(52) U.S. Cl. ............... 438/704; 738/638; 257/E21.226; 257/E21.252; 257/E21.257

(58) Field of Classification Search ................. 438/637, 438/638, 672, 704, 745, 750, 781
See application file for complete search history.

(56) References Cited

U.S. PATENT DOCUMENTS

| | | | | |
|---|---|---|---|---|
| 5,645,887 A * | 7/1997 | Byun | ...... | 438/655 |
| 5,907,772 A * | 5/1999 | Iwasaki | ...... | 438/253 |
| 6,638,853 B1 * | 10/2003 | Sue et al. | ...... | 438/633 |
| 7,009,297 B1 * | 3/2006 | Chiang et al. | ...... | 257/738 |
| 2006/0110941 A1 * | 5/2006 | Yen et al. | ...... | 438/781 |
| 2006/0211254 A1 * | 9/2006 | Liu et al. | ...... | 438/717 |

* cited by examiner

*Primary Examiner*—Quoc D Hoang
(74) *Attorney, Agent, or Firm*—Tung & Associates

(57) ABSTRACT

A method for forming a dual damascene structure in a semiconductor device manufacturing process where via plugs which may include a thickness portion of a plug filling material overlying the process surface is formed by diffusing an acid into a plug filling material layer followed by reacting the acid with the plug filling material layer to form a soluble portion which is then removed using a solvent. A remaining portion of the plug filling material is cured and a BARC layer may be formed over the process surface prior to patterning trenches in an overlying resist layer and forming a dual damascene structure.

23 Claims, 5 Drawing Sheets

VIA PLUG FORMATION IN DUAL DAMASCENE PROCESS

FIELD OF THE INVENTION

This invention generally relates to integrated circuit manufacturing of multi-layered semiconductor devices and more particularly to a method for forming dual damascene structures with an improved patterning process including an improved method for forming a protective via plug.

BACKGROUND OF THE INVENTION

The escalating requirements for high density and performance associated with ultra large scale integration semiconductor wiring demand increasingly sophisticated interconnection wiring formation processes. As device sizes decrease along with interconnect wiring critical dimensions, process windows for plasma etching of interconnect wiring damascene features are increasingly narrowed, leaving little room for error.

In dual damascene formation processes, for example, in a via-first method of formation, a via opening is first formed followed by patterning an overlying trench etching mask and etching the trench overlying the via opening. Prior art processes have proposed various schemes for protecting the via opening from additional etching during the trench etching process. For example, filling the via opening with a plug of protective material prior to forming the trench are among the proposed schemes in the prior art.

Many prior art dual damascene formation processes rely on plasma etchback of the via plug filling material following filling of the via opening. One drawback of prior art processes is the difficulty in precisely controlling the thickness of the plug filling material and the process surface topography following etchback. For example, the plasma etchback process can lead to subsequent difficulties in forming a desired overlying resist thickness for trench patterning, thereby leading to degradation of trench etching mask critical dimensions. For example, following a plasma etchback process, an undesirable process surface topography can lead to undesirable variations in the thickness of a subsequently formed overlying trench patterning resist, thereby leading to variations in surface reflectivity, resist exposure, and consequently, degraded critical dimension control. Moreover, plasma etchback processes are a relatively expensive process in terms of equipment and materials.

There is therefore a need in the semiconductor device integrated circuit processing art to develop an improved dual damascene manufacturing process to provide for via protection in a trench etching process while avoiding loss of critical dimension in the trench patterning process.

It is therefore an object of the invention to provide an improved dual damascene manufacturing process to provide for via protection in a trench etching process while avoiding loss of critical dimension in the trench patterning process, in addition to overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a dual damascene structure in a semiconductor device manufacturing process to improve a trench patterning and etching process.

In a first embodiment, the method includes providing a process wafer comprising a via opening extending through a dielectric insulating layer thickness; forming a plug filling material layer on the process wafer process surface to include filling the via opening to form a via plug; diffusing an acid into the plug filling material layer; heating the plug filling material layer to react the acid with the plug filling material layer to form a soluble thickness portion of the plug filling material layer; removing the soluble thickness portion in a solvent to leave a remaining thickness portion of the plug filling material layer; forming a resist layer over the remaining thickness portion of the plug filling material layer; photolithographically patterning the resist layer to form a trench etching mask; and, etching a trench to form a dual damascene structure.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Although the method of the present invention is explained by exemplary reference the formation of a via-first method of formation of a dual damascene structure in a multi-level semiconductor device, it will be appreciated that the method of the present invention is equally applicable to forming a structure where one etched opening is formed overlying and at least partially encompassing one or more underlying etched openings. The method of the present invention is particularly advantageous in preventing etching damage to underlying vias in a trench forming dual damascene process while improving critical dimension control in trench etching mask patterning and trench etching in addition to having improved process economies.

While the method of the present invention is explained with exemplary reference to the formation of a copper filled dual damascene structure, it will be appreciated that the method is applicable for other conductive materials including tungsten, aluminum, and copper alloys, as well as the use of appropriate adhesion/barrier liners. It will further be appreciated that the method may be applicable to dual damascenes with or without middle etch stop layers formed between dielectric insulating layers to separate a via portion and trench portion of the dual damascene. The method however, is more preferably used and advantageous for formation of dual damascenes without middle etch stop layers where a single dielectric insulating layer includes both the via portion and the trench portion of the dual damascene structure.

For example, in an exemplary embodiment, referring to FIGS. 1A-1F, are shown schematic cross sectional views of a portion of a multi-level semiconductor device at stages in a dual damascene manufacturing process.

Figure 1A:
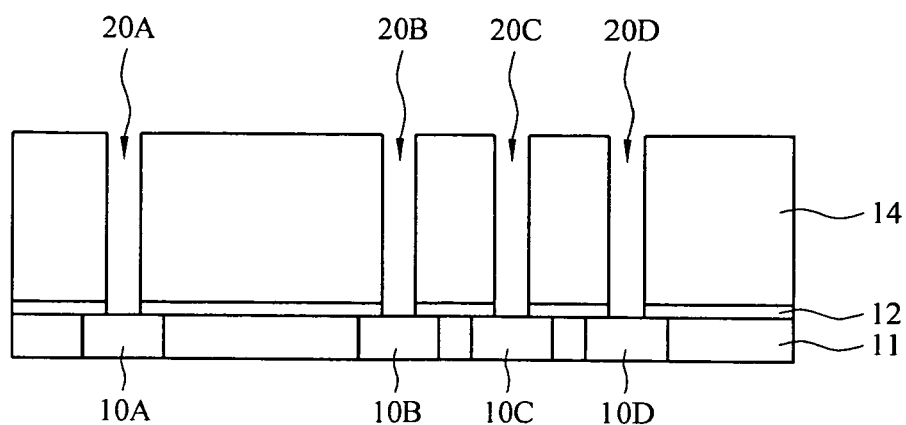
FIGS. 1A-1F are exemplary cross sectional views of a portion of a process wafer including a dual damascene structure at stages in manufacturing process according to an embodiment of the present invention.

Referring to FIG. 1A, is shown a portion of an underlying substrate 11. The substrate 11 may include conductive regions e.g., 10A, 10B, 10C, 10D, for example, conductive damascenes formed in a dielectric insulating substrate (layer) 11 in a multi-level wiring device. An overlying etch stop layer 12 may be formed over the underlying material layer 11, for example, formed of silicon nitride (e.g., SiN), silicon oxynitride, silicon carbide (SiC), nitrogen or oxygen doped silicon carbide (e.g., SiOC, SiCN), or combination thereof. Typically, the etch stop layer 12 has a thickness of about 200 Angstroms to about 800 Angstroms.

Still referring to FIG. 1A, formed over etch stop layer 12 is dielectric insulating layer 14, also referred to as an inter-metal dielectric (IMD) layer, preferably formed of silicon oxide, a low-K (low dielectric constant) material, such as fluorinated silicate glass (FSG), carbon doped silicon oxide, organosilane glass (OSG), or combinations thereof. It will be appreciated that other inorganic or organic low-K materials, as are known in the art may also be used to form the IMD layer 14. Preferably the IMD layer 14 is formed of a low-K silicon oxide based material having a dielectric constant of less than about 3.2, more preferably less than about 2.8. Typically, the IMD layer is formed having a thickness of about 3000 to about 7000 Angstroms.

Still referring to FIG. 1A, following deposition of the IMD layer 14, a bottom anti-reflectance coating (BARC) layer (not shown), formed of an organic or inorganic material may be formed over the IMD layer 14, prior to forming an overlying via patterning resist layer (not shown). A via etching mask is formed in the overlying resist layer according to a conventional photolithographic patterning process followed by a conventional plasma assisted etching process (e.g., a reactive ion etch) to form via openings 20A, 20B, 20C, and 20D. For example, the via openings may extend through the underlying etch stop layer 12 to expose underlying conductive regions, e.g., 10A, 10B, 10C, and 20D.

Figure 1B:
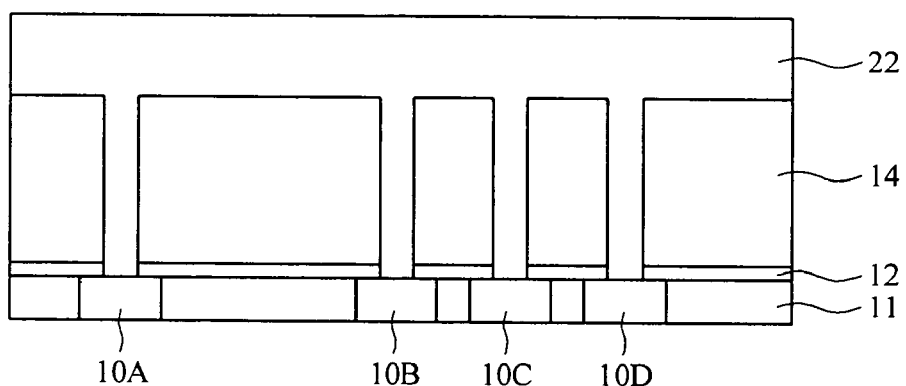

Referring to FIG. 1B, following formation of the via openings and removal of the overlying via patterning resist layer, in an important aspect of the invention, a plug filling material 22, preferably diffusible to, and reactive with, an acid, is blanket deposited by a conventional processes, for example a spin-coating process, to fill the via openings including forming a thickness portion overlying the process surface above the via opening level. For example, the plug filling material is preferably an organic resinous (polymeric) material that may or may not include a photosensitizer (e.g., a photoresist). Preferably, the plug filling material is reactive with an acid such that following diffusing of acid species into the plug filling material, subsequent thermal activation of the acid causes a chemical reaction with the plug filling material to render the plug filling material soluble in a solvent, for example, a developer solution. It will be appreciated that the plug filling material may be a photoresist that may or may not contain a photo-acid generator (PAG).

The plug filling material layer 22 is then optionally subjected to a soft bake, for example at a temperature of from about 80° C. to about 110° C. followed by exposure to an acid species. In the embodiment shown, the acid species may be included in a solution or vapor to contact the upper portion of the plug filling material layer 22. Where the plug filling material is a resist including a protecting chemical group, the absorbed (diffused) acidic species preferably reacts with the protecting group upon heating the plug filling material to remove the protecting group and make it soluble in a developer solution. It will be appreciated that the extent and depth of acid absorption will depend in part on the diffusion coefficient of the acid in the plug filling material, which also depends in part on the time and temperature of the optional soft-bake process as well as a subsequent post-acid exposure baking process.

Following exposure of the plug filling material to the acid, the plug filling material is preferably subjected to a second baking process (post-acid exposure baking process), for example at a temperature of about 80° C. to about 130° C., to enhance both acid diffusion within the plug filling material and to initiate reaction of the absorbed acid species with the plug filling material to render it soluble in a developer solution. It will be appreciated that the height of a subsequently formed plug filling material layer remaining after development will depend in part on the time period and temperature of the post-acid exposure baking process.

Figure 1C:
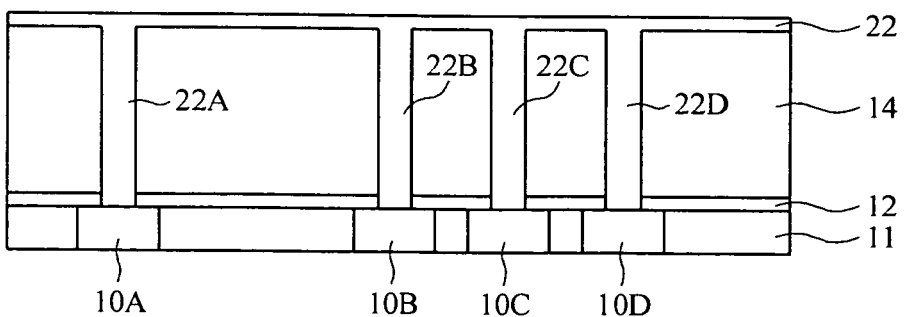

Referring to FIG. 1C, following the post-acid exposure baking process, the plug filling material layer 22 is exposed to a developer solution to remove the soluble portions including an upper thickness portion of the plug filling material layer. A thickness portion of the plug filling material layer 22 is preferably removed to leave a remaining plug filling material layer thickness portion extending at least up to the via opening level or including a predetermined thickness portion of the plug filling material layer 22 overlying the process surface above the via opening level. In the embodiment shown in FIG. 1C, the plug filling material is removed to leave a thickness of the plug filling material layer 22 overlying the process surface above the via opening level, preferably by about 500 Angstroms or less, more preferably about 200 Angstroms or less. Any developer solution may be used, more preferably an alkaline developer solution, for example including tetra methyl ammonium hydroxide (TMAH) at a concentration of from about 2 to about 3 wt %.

Following removal of a thickness portion of the plug filling material layer 22, the remaining plug filling material layer portion including the via plugs, e.g., 22A, 22B, 22C, and 22D, are preferably subjected to a hard bake and/or ultraviolet (UV) light to induce additional plug filling material polymeric cross-linking. For example the hard bake process is carried out at a temperature of from about 100° C. to about 160° C., preferably at a higher temperature than the post-acid exposure baking process. The plug filling material is preferably hard baked and/or UV cured to prevent interaction with subsequently formed overlying trench patterning resist.

Figure 1D:
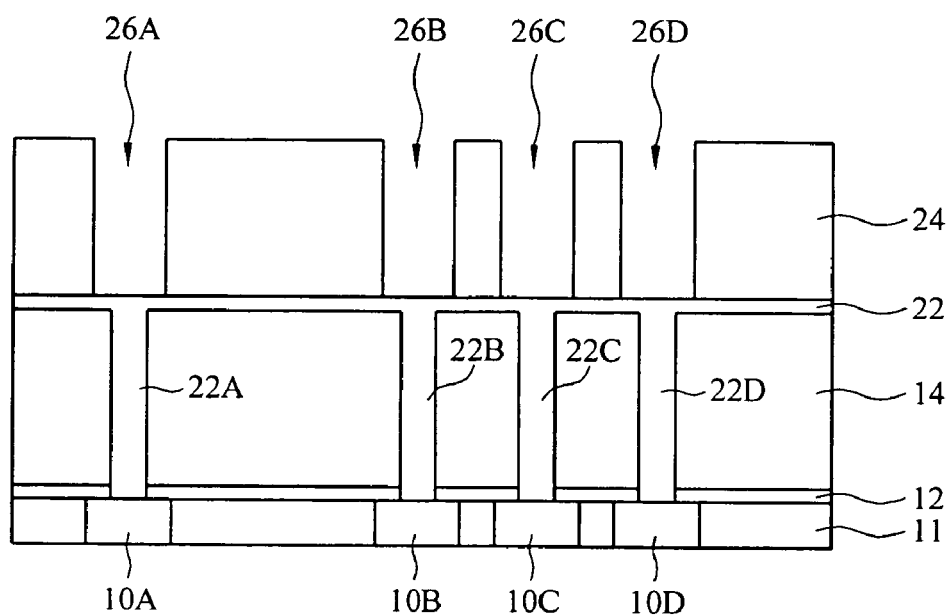
Figure 1E:
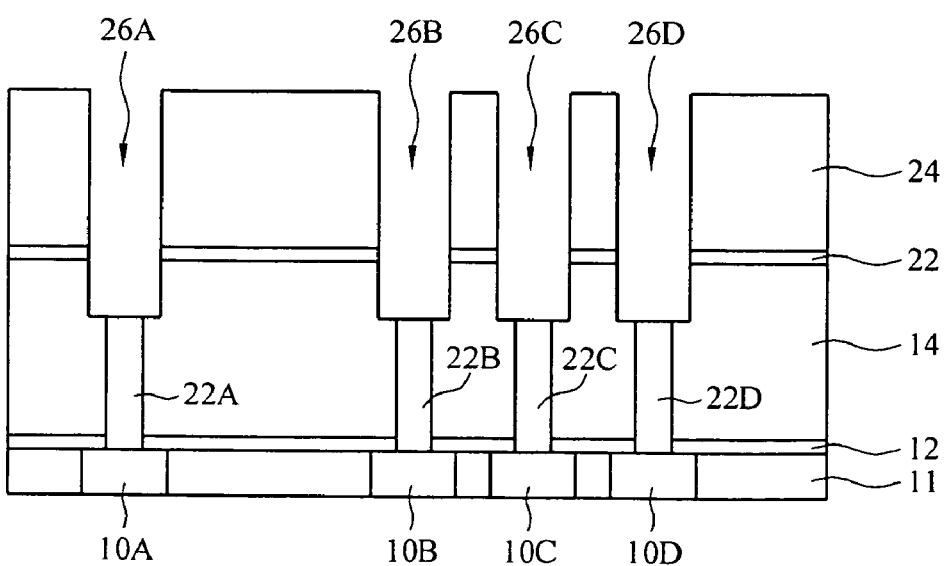

Referring to FIG. 1D, following curing of the plug filling material layer 22, an overlying trench patterning resist layer 24 for patterning a trench etching mask is formed on the process surface. The resist layer 24 is then lithographically patterned by a conventional lithographic, e.g. photolithographic process to form a resist etching mask including trench opening patterns e.g., 26A, 26B, 26C, and 26D.

Figure 2A:
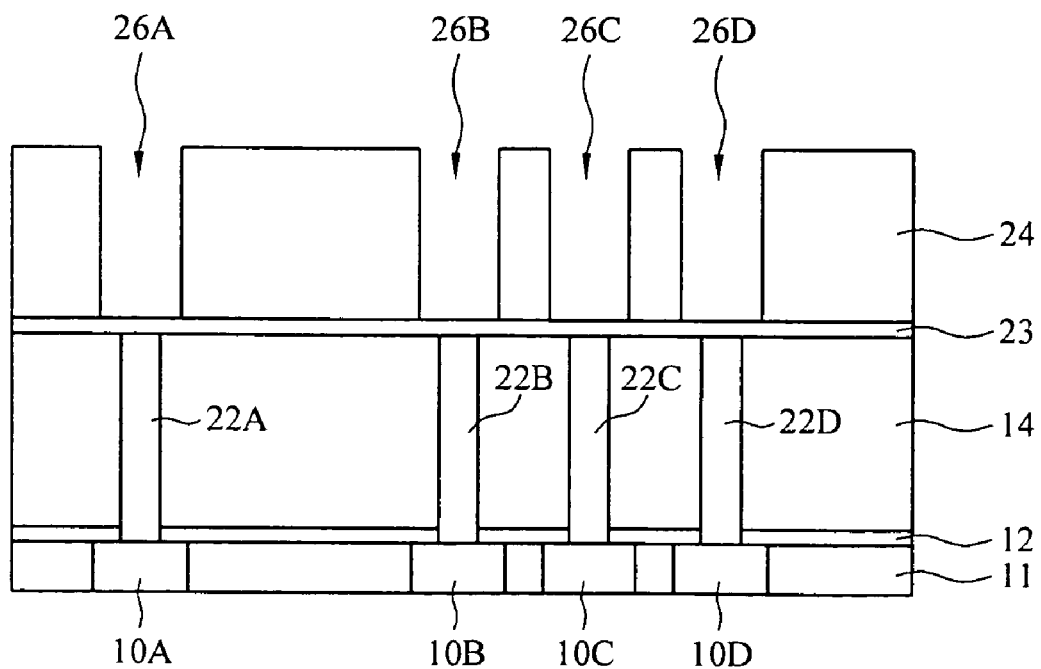
FIG. 2A-2B are exemplary cross sectional views of a portion of a process wafer including a dual damascene structure at stages in a manufacturing process according to an embodiment of the present invention.

Turning to FIG. 2A are shown depictions of alternative embodiments according to the present invention. For example, referring to FIG. 2A, the plug filling material 22 is removed to leave via plugs 22A, 22B, 220, and 22D about coplanar with the via opening level, e.g., exposing the upper surface of the IMD layer 14. In this embodiment, prior to forming the overlying resist layer 24, a BARC layer 23, preferably an organic BARC layer, is formed overlying the IND layer 14. The overlying resist layer 24 is then formed and a photolithographic process to form an etching mask including trench opening patterns e.g., 26A, 26B, 26C, and 26D are formed. A subsequent plasma etching process is carried out to extend the trench opening patterns through the BARC layer 23 and into a thickness portion of the IMD layer 14 to form dual damascene structures as shown below in FIG. 1E.

Figure 2B:
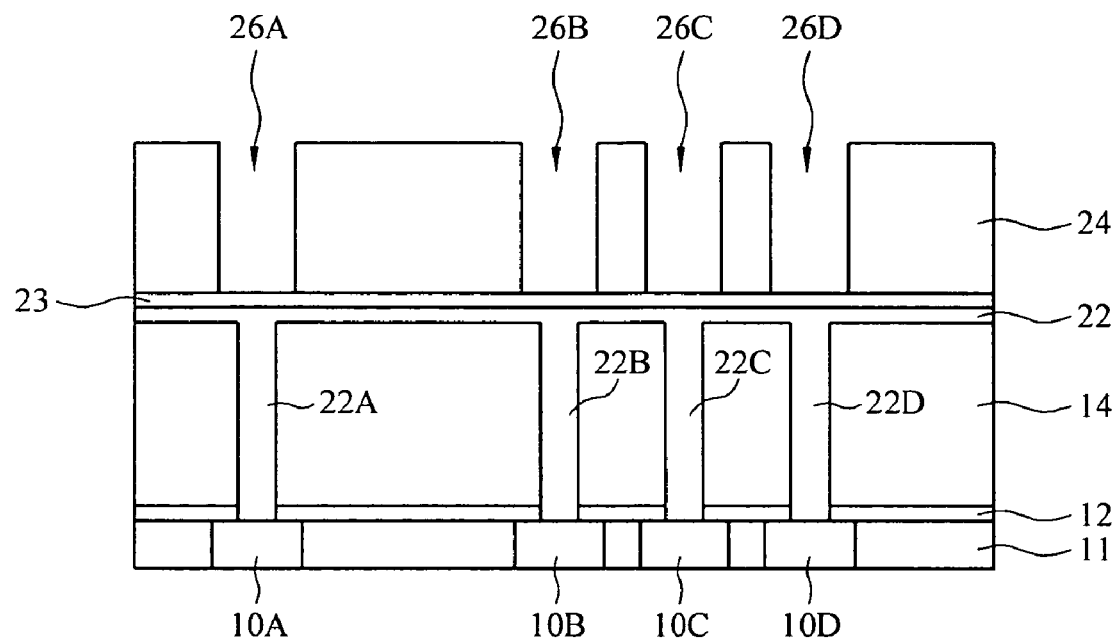

Referring to FIG. 2B, the BARC layer 23 is optionally formed over the plug filling material layer 22 which is removed to leave a preferred thickness overlying the IMD layer 14 surface. The resist layer 24 and trench opening patterns e.g., 26A, 262, 26C, and 26D are formed as in FIG. 2A and an etching process carried out to form dual damascene structures as shown below in FIG. 1E.

Figure 3:
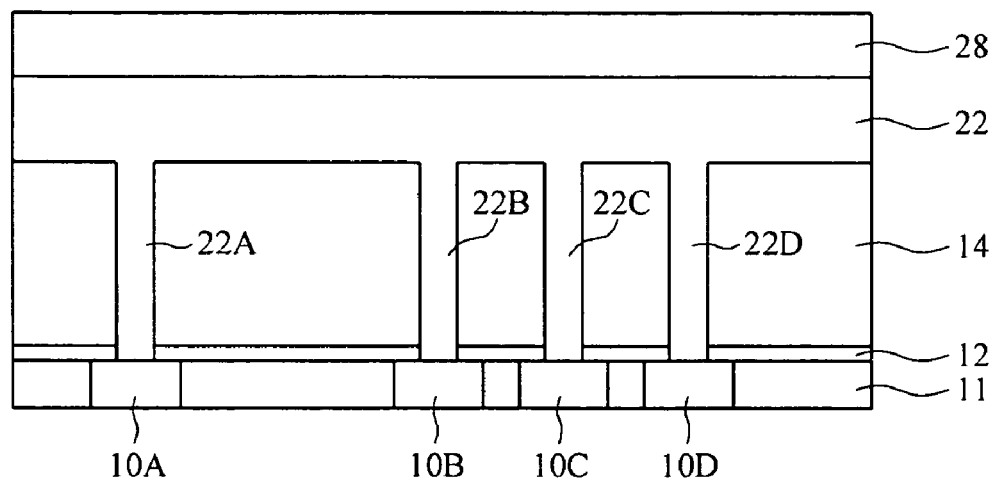
FIG. 3 is an exemplary cross sectional view of a portion of a process wafer including a dual damascene structure at a stage in a manufacturing process according to an embodiment of the present invention.

Turning to FIG. 3, is shown an alternative method of exposing the plug filling material layer 22 to an acid prior to the post exposure acid baking process. Following deposition (e.g., spin-on) of the plug filling material layer 22, and following an optional soft bake process, an acid containing resinous polymer layer 28, for example an acid containing organic TARC (top anti-reflective coating), preferably water soluble, is formed on the plug filling material layer 22. A drive-in baking process is then performed whereby acidic species in the acid containing polymer diffuses by thermal activation into the plug filling material.

The depth of diffusion and reaction of the acidic species into the plug filling material layer 22 is preferably controlled such that a desired remaining height of the plug filling material layer 22 is obtained following a subsequent developing process according to preferred embodiments outlined above. The drive-in baking process may also serve as the post-acid exposure baking process where both drive-in of the acid species and reaction of the acid species with the plug filling material layer 22 takes place in one step. Alternatively, a separate drive-in baking process and a post-acid exposure baking process may be carried out. For example, the depth of diffusion into, and subsequent reaction of the acid species with, the plug filling material layer 22 will depend in part on the diffusivity of the acid species in the plug filling material as well as the temperature and time of the drive-in baking process. For example, the drive-in baking process may take place at a temperature of about 80° C. to about 160° C.

Following reaction of the acid species with the plug filling material to render a desired thickness portion of the plug filling material layer 22 soluble, a subsequent rinsing process (e.g., deionized water) may then be carried out to remove the acid containing polymer layer 28 prior to the developing process. As shown in previous embodiments e.g., FIGS. 1C, 2A, and 2B, a thickness portion of the plug filling material layer 22 may then be removed in a developing process as previously outlined to leave a thickness portion above the via opening level at preferred thicknesses, or may be removed to leave via plugs about co-planar with the IMD layer 14. As previously shown, particularly where the IMD layer 14 upper surface is exposed, an overlying organic BARC layer is preferably formed over the IMD layer surface prior to forming the overlying trench patterning resist layer 24 and proceeding as previously outlined and as outlined below.

Turning back to FIG. 1E, following formation of trench etching mask in resist layer 24, a conventional plasma assisted etching process is then carried out to extend trench opening patterns e.g., 26A, 26B, 26C, and 26D into an upper portion of the IMD layer 24, for example, extending to a depth of about one-fourth to about one-half of the height of the IMD layer 14 and reducing the height of via plugs e.g., 22A, 22B, 22C, and 22D.

Figure 1F:
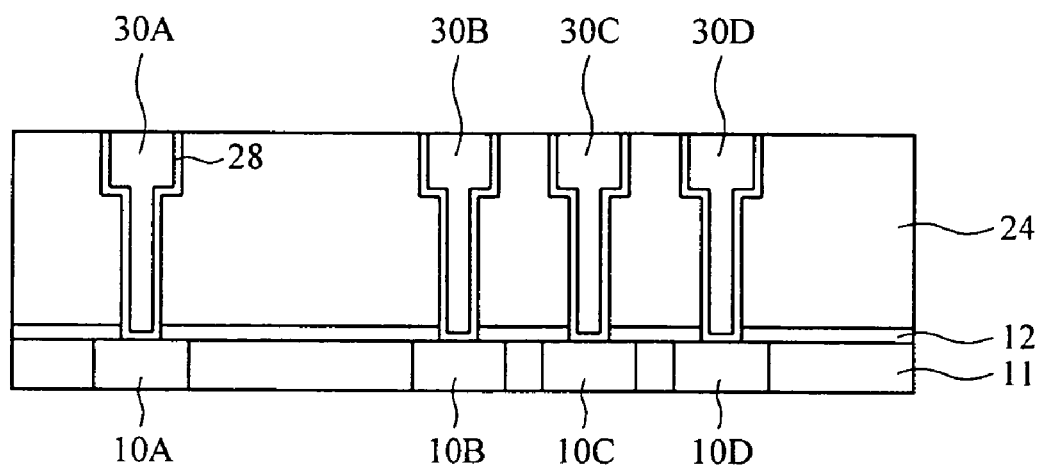

Referring to FIG. 1F, remaining organic material portions (e.g., resist layer 24, BARC layer 22B, and via plugs are then removed by a conventional stripping process e.g., wet stripping and/or plasma ashing to form dual damascene openings.

Conventional processes are then carried out for backfilling the dual damascene openings (via and trench portions) with a metal. For example, a barrier layer e.g., 28 including one of a refractory metal, refractory metal nitride, including silicided versions thereof e.g., Ti, Ta, TiN, TaN, TiSiN, TaSiN, appropriate to prevent diffusion of the metal filling into the IMD layer, is formed to line the dual damascene openings. For example, TaN is a preferred barrier material where copper is used to backfill the dual damascene openings. A metal filling process is then carried out, for example physical vapor deposition (PVD), chemical vapor deposition (CVD), or electrochemical deposition (ECD) (e.g., copper filling) onto a metal seed layer (not shown). A chemical mechanical polish (CMP) process is then performed to remove excess material layers over the IMD layer 14 surface e.g., excess copper and barrier layer 28, to define and complete the dual damascene formation process to form metal filled dual damascene e.g., 30A, 30B, 30C, and 30D.

Thus, an improved method for forming dual damascenes has been presented whereby a thickness of a plug filling material is advantageously controlled to improve a surface planarity prior to forming an overlying trench patterning resist thereby improving the trench patterning process. For example, compared to prior art dry etchback processes the present invention improves a process flow by using a lower cost process with improved results. It is noted that a CMP process is not practical for use with the plug filling material, particularly a polymeric material. Moreover, the present process allows for optional formation of a BARC layer prior to forming the overlying trench patterning resist, or leaving a sufficiently planar remaining thickness portion of the plug filling material without a need for forming an overlying BARC layer. The method is particularly advantageous for use in a via first damascene formation process without a middle etch stop layer in a time determined trench etching process.

Figure 4:
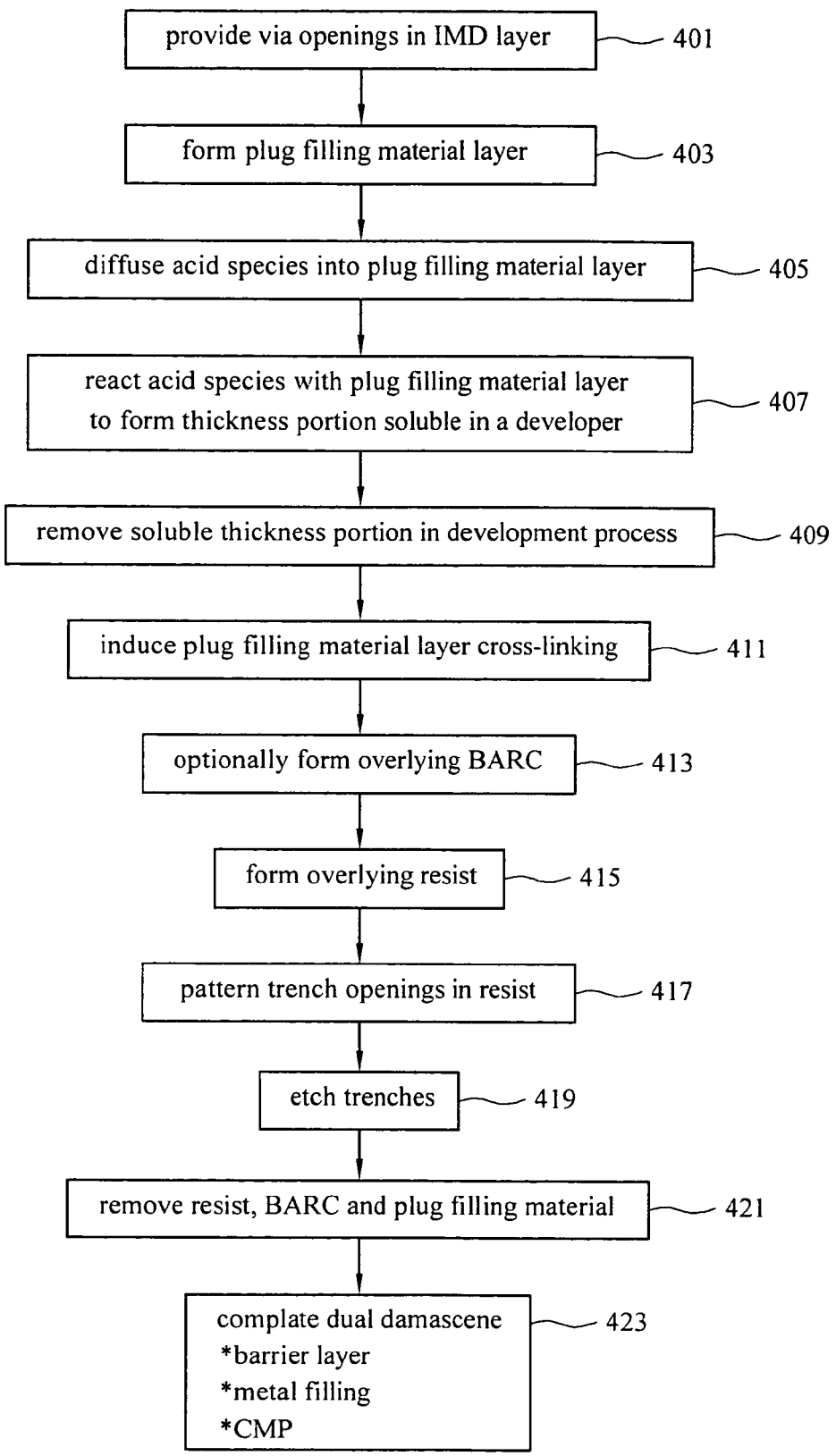
FIG. 4 is a process flow diagram including several embodiments of the method of the present invention.

Referring to FIG. 4 is shown a process flow diagram including several embodiments of the present invention. In process 401, via openings are provided in an IMD layer. In process 403, a plug filling material layer is formed over the IMD layer to include filling the via openings. In process 405, an acid species is diffused into the plug filling material layer from an uppermost portion of the plug filling material layer. In process 407, the acid species is reacted with the plug filling material layer according to a baking process to render a thickness portion of the plug filling material layer soluble in a developer solution. In process 409, a developing process is carried out with a developing solution to remove the soluble thickness portion of the plug filling material layer to leave a via plug filling at least up to the via opening level. In process 411, the remaining portion of the plug filling material is subjected to a hard bake process and/or UV irradiation to induce polymeric cross-linking in the plug filling material. In process 413, an organic BARC layer is then optionally formed on the process surface. In process 415, a trench patterning resist layer is formed on the process surface. In process 417 trench openings are photolithographically patterned overlying the via plugs to form a trench etching mask. In process 419, a trench etching process is carried out to form trench openings extending through a thickness portion of the IMD layer to form dual damascene openings. In process 421, remaining organic materials are removed, e.g., resist portions, BARC layer, and plug filling material. In process 423, the dual damascene is completed by conventional barrier layer formation, metal filling, and planarization (CMP) processes.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a dual damascene structure in a semiconductor device manufacturing process comprising the steps of:
   providing a process wafer comprising a via opening extending through a dielectric insulating layer thickness;
   forming a resinous polymer plug filling material layer on the process water process surface to include filling the via opening to form a via plug;
   diffusing an acid into the plug filling material layer;
   heating the plug filling material layer to react the acid with the plug filling material layer to form a soluble thickness portion of the plug filling material layer;
   removing the soluble thickness portion in a solvent to leave a remaining thickness portion of the plug filling material layer, said plug filling material layer not subjected to CMP;
   forming a resist layer over the remaining thickness portion of the plug filling material layer;
   photolithographically patterning the resist layer to form a trench etching mask; and,
   etching a trench to form a dual damascene structure.

2. The method of claim 1, further comprising the step of forming an organic bottom anti-reflectance coating (BARC) on the remaining thickness portion of the plug filling material layer prior to forming the resist layer.

3. The method of claim 1, wherein the remaining thickness portion of the plug filling material layer has a thickness of less than about 500 Angstroms extending above the via opening upper level.

4. The method of claim 1, wherein the remaining thickness portion of the plug filling material layer has a thickness of less than about 200 Angstroms extending above the via opening upper level.

5. The method of claim 1, wherein the remaining thickness portion of the plug filling material layer consists of the via plug having an upper surface portion about coplanar with the via opening upper level.

6. The method of claim 1, wherein the acid is diffusible in the plug filling material layer.

7. The method of claim 1, wherein the acid is applied to an upper surface portion of the plug filling material layer by a contact method selected from the group consisting of contacting with a solution, and contacting with a vapor.

8. The method of claim 1, wherein a resinous polymer containing the acid is applied to an upper surface portion of the plug filling material layer.

9. The method of claim 8, further comprising heating the resinous polymer containing the acid to diffuse the acid.

10. The method of claim 1, further comprising treating plug filling material layer to induce polymeric cross-linking following the step of removing by a method selected from the group consisting of heating and exposure to ultraviolet (UV).

11. The method of claim 1, wherein the solvent comprises a developer solution.

12. The method of claim 1, wherein the solvent comprises tetra methyl ammonium hydroxide (TMAH).

13. The method of claim 1, further comprising the step of filling the dual damascene structure with a metal selected from the group consisting of aluminum, tungsten, copper, and alloys thereof.

14. A method for forming a dual damascene structure in a semiconductor device manufacturing process comprising the steps of:
   providing a process wafer comprising a via opening extending through a dielectric insulating layer thickness;
   forming a resinous polymer plug filling material layer on the process wafer process surface to include filling the via opening to form a via plug;
   diffusing an acid into the resinous polymer plug filling material layer;
   heating the plug filling material layer to react the acid with the plug filling material layer to form a soluble thickness portion of the plug filling material layer;
   removing the soluble thickness portion in a developer solution to leave a remaining thickness portion of the resinous plug filling material layer, said plug filling material layer not subjected to CMP;
   curing the remaining thickness portion according to one of a thermal and ultraviolet (UV) irradiation process;
   forming a resist layer over the remaining thickness portion of the resinous plug filling material layer following the step of curing;
   photolithographically patterning the resist layer to form a trench etching mask; and, etching a trench to form a dual damascene structure.

15. The method of claim 14, further comprising the step of forming an organic bottom anti-reflectance coating (BARC) on the remaining thickness portion of the resinous plug filling material layer prior to forming the resist layer.

16. The method of claim 14, wherein the remaining thickness portion has a thickness of less than about 500 Angstroms extending above the via opening upper level.

17. The method of claim 14, wherein the remaining thickness portion has a thickness of less than about 200 Angstroms extending above the via opening upper level.

18. The method of claim 14, wherein the remaining thickness portion consists of the via plug having an upper surface portion about coplanar with the via opening upper level.

19. The method of claim 14, wherein the acid is applied to an upper surface portion of the plug filling material layer by a contact method selected from the group consisting of contacting with a solution and contacting with a vapor.

20. The method of claim 14, wherein a water soluble resinous polymer containing the acid is applied to an upper surface portion of the plug filling material layer.

21. The method of claim 20, further comprising heating the water soluble resinous polymer containing the acid to diffuse the acid.

22. The method of claim 14, wherein the developer solution comprises tetra methyl ammonium hydroxide (TMAH) at a concentration of about 2 to about 3 percent by weight.

23. The method of claim 14, further comprising the step of filling the dual damascene structure with a metal selected from the group consisting of aluminum, tungsten, copper, and alloys thereof.

* * * * *